United States Patent
Ho et al.

(10) Patent No.: US 12,014,987 B2
(45) Date of Patent: *Jun. 18, 2024

(54) ELECTRO-MIGRATION REDUCTION

(71) Applicant: Taiwan Semiconductor Manufacturing Co., Ltd., Hsinchu (TW)

(72) Inventors: Yi-Chen Ho, Hsinchu (TW); Chien Lin, Hsinchu (TW); Cheng-Yeh Yu, Hsinchu (TW); Hsin-Hsing Chen, Hsinchu (TW); Ju Ru Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/869,012

(22) Filed: Jul. 20, 2022

(65) Prior Publication Data
US 2022/0359411 A1 Nov. 10, 2022

Related U.S. Application Data

(63) Continuation of application No. 17/017,356, filed on Sep. 10, 2020, now Pat. No. 11,450,609.

(60) Provisional application No. 63/032,467, filed on May 29, 2020.

(51) Int. Cl.
*H01L 23/532* (2006.01)
*H01L 21/768* (2006.01)
*H01L 23/522* (2006.01)

(52) U.S. Cl.
CPC .. *H01L 23/53238* (2013.01); *H01L 21/76834* (2013.01); *H01L 21/76846* (2013.01); *H01L 21/76849* (2013.01); *H01L 21/76871* (2013.01); *H01L 23/5226* (2013.01)

(58) Field of Classification Search
CPC ......... H01L 23/53238; H01L 21/76834; H01L 21/76846; H01L 21/76849; H01L 21/76871; H01L 23/5226
See application file for complete search history.

(56) References Cited

U.S. PATENT DOCUMENTS

| | | | |
|---|---|---|---|
| 5,447,887 | A | 9/1995 | Filipiak |
| 6,207,552 | B1 | 3/2001 | Wang |
| 6,258,713 | B1 | 7/2001 | Yu |
| 6,518,167 | B1 | 2/2003 | You |
| 6,579,703 | B2 | 6/2003 | Robb |

(Continued)

FOREIGN PATENT DOCUMENTS

| | | |
|---|---|---|
| CN | 104299958 A | 1/2015 |
| KR | 100207470 B1 | 7/1999 |

(Continued)

*Primary Examiner* — Karen Kusumakar
(74) *Attorney, Agent, or Firm* — Haynes and Boone, LLP

(57) ABSTRACT

The present disclosure provides a structure and a method to reduce electro-migration. An interconnect structure according to the present disclosure includes a conductive feature embedded in a dielectric layer, a capping barrier layer disposed over the conductive feature and the dielectric layer, and an adhesion layer sandwiched between the capping barrier layer and the dielectric layer. The adhesion layer includes a degree of crystallinity between about 40% and about 70%.

20 Claims, 12 Drawing Sheets

(56) References Cited

U.S. PATENT DOCUMENTS

| | | |
|---|---|---|
| 6,660,650 B1 | 12/2003 | Konecni |
| 6,723,631 B2 | 4/2004 | Noguchi |
| 9,520,362 B2 | 12/2016 | Lin |
| 9,613,856 B1 | 4/2017 | Yang |
| 9,716,032 B2 | 7/2017 | Tang |
| 9,972,529 B2 | 5/2018 | Yang |
| 10,163,691 B2 | 12/2018 | Shih |
| 10,170,322 B1 | 1/2019 | Cheng |
| 2008/0122103 A1* | 5/2008 | Bonilla ............. H01L 21/76825 |
| | | 257/E23.161 |
| 2020/0090986 A1 | 3/2020 | Lin |
| 2020/0388524 A1* | 12/2020 | Yang ................ H01L 21/02063 |
| 2021/0159163 A1* | 5/2021 | Liff .................. H01L 23/53228 |

FOREIGN PATENT DOCUMENTS

| | | |
|---|---|---|
| KR | 20160111508 A | 9/2016 |
| WO | 2015112289 A1 | 7/2015 |

\* cited by examiner ically along the grain boundaries. Copper, which comes with higher activation energies than aluminum along grain boundaries, is less susceptible to electro-migration along the grain boundaries. Because copper has a low activation energy along its interfaces with a dielectric layer, electro-migration of copper is predominantly along such interfaces. To reduce or prevent electro-migration of copper, copper features in an interconnect structure are lined by barrier layers and capped by capping barrier layers. The effectiveness of such barrier layers and capping barrier layers depends on how well they adhere to the copper features.

ELECTRO-MIGRATION REDUCTION

PRIORITY DATA

This application is a continuation of U.S. patent application Ser. No. 17/017,356, filed Sep. 10, 2020, which claims the benefit of U.S. Provisional Application No. 63/032,467, entitled "Interconnect Structure," filed May 29, 2020, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, to prevent deterioration of a conductive feature due to contact with adjacent dielectric layer, the contact feature may be lined with a barrier layer and capped by a capping barrier layer. While existing interconnect structures are generally adequate for their intended purposes, they are not satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A, 2B, 3, 4A-7A, and 4B-7B illustrate fragmentary cross-sectional views of a workpiece undergoing various stages of operations in the method of FIG. 1, in accordance with one or more aspects of the disclosure.

DETAILED DESCRIPTION

Figure 1:
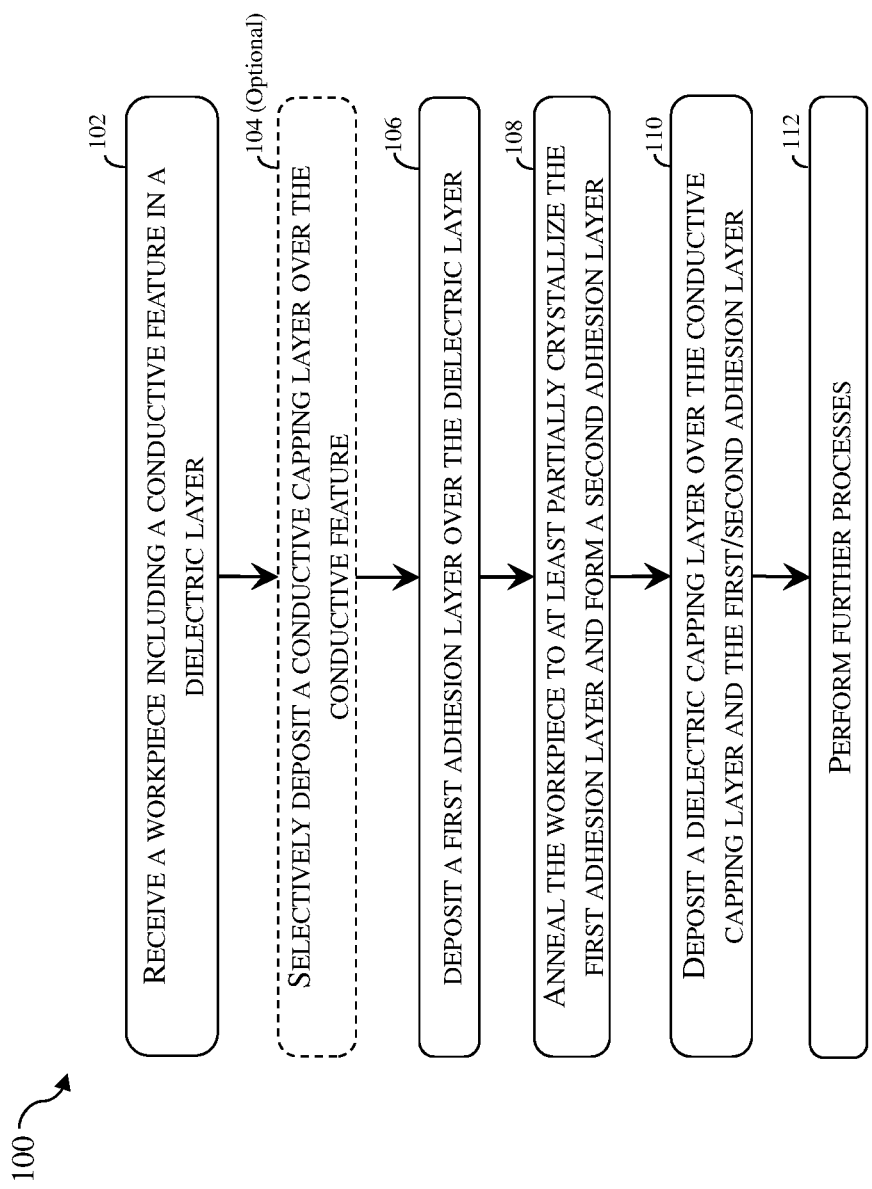
FIG. 1 illustrates a flow chart of a method of forming an interconnect structure or a portion thereof, in accordance with one or more aspects of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to electro-migration reduction or elimination and, more particularly, to deposition of an adhesion layer to improve adhesion of a capping barrier layer.

The IC fabrication industry has gone over different conductive materials to improve performance of interconnect structures. For example, aluminum was once a popular conductive material for construction of interconnect structure because of its ready integration with IC fabrication processes and its improved conductivity as compared to doped polysilicon. Due to its susceptibility to electro-migration and inferior conductivity compared to copper, aluminum fell out of favor and was gradually replaced by copper, despite the various difficulties in integrating copper into IC fabrication processes. However, while copper is less susceptible to electro-migration, it is not immune to it. Electro-migration refers to material migration due to presence of current flows. The moving electrons in the current flow are scattered by metal ions in the crystal lattice and their momentum may be transferred to the metal ions. This momentum transfer from the electrons to the metal ions creates a momentum transfer force. When this momentum transfer force is greater than an activation energy of the conductor, a diffusion process of the metal ions along the direction of the moving electrons may be resulted, hence electro-migration.

Electro-migration is non-homogeneous for several reasons, such as different activation energy levels, different stress distributions, changes of materials, changes of shapes, and different temperature gradients. For example, a conductive material may have different activation energy in different regions, resulting in differential electro-migration. In this regard, aluminum has low activation energies along grain boundaries and electro-migration in aluminum is predominantly through grain boundaries. Copper has low activation energies on surfaces and electro-migration in copper is primarily on or along surfaces. In terms of a conductive feature, migration of metal atoms along different diffusion paths may result in depletion or accumulation of metal. Depletion is manifested as voids or vacancies and accumulation is manifested as whiskers or hillocks. The growth of voids may cause an onset of a positive feedback loop that accelerates formation of defects. In the positive feedback loop, voids cause current crowding and increase local current density near the voids, the local current density increase leads to Joule heating, Joule heating causes lowering of activation energies, and the lowered activation energies in turn speed up the material diffusion.

Copper conductive features may be fabricated using, for example, Damascene processes or Duel-Damascene processes. In an example Damascene process, an opening (a via opening or a trench) is formed in a dielectric layer using lithography and etching processes. Copper is then deposited in the opening and a planarization process is performed to remove excess copper, leaving a copper conductive feature in the opening. In an example Dual-Damascene process, a trench is formed in a dielectric layer and a via opening is formed in another dielectric layer below the dielectric layer and both the trench and the via opening are filled with copper. Allowing copper to come in contact with silicon or silicon oxide has negative implications. For example, copper may diffuse into silicon to degrade the semiconductor properties of silicon and lead to formation of less conductive copper silicide. Oxygen in silicon oxide and copper in the copper conductive layer may inter-diffuse and degrade the conductivity of the copper conductive layer. To prevent copper's contact with silicon and silicon oxide, barrier layers or liners may be implemented to encapsulate the copper conductive feature. As described above, because the activation energies for copper is the lowest at surfaces, if any barrier layer or liner does not adhere well to copper, surfaces may be produced to initiate an accelerated process of electro-migration, thereby impacting device performance and lifetime. Taking a copper conductive feature in a dielectric layer for example, if a capping barrier layer formed over the copper conductive feature and the dielectric layer does not adhere well to copper conductive feature and dielectric layer, surfaces on the copper conductive feature may increase. Voids and hillocks may grow faster around such surfaces and the positive feedback loop will accelerate the formation of voids and hillocks, resulting in via bond defects (VBDs), time-dependent dielectric breakdown (TDDB) and resistive-conductive (RC) delay. Here, VBDs refer to defects at the interface between a contact via and a contact feature. TDDB refers to degradation of dielectrics due to copper diffusion. RC delay refers to be increase of resistance and/or conductance due to formation of voids or hillocks.

As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. The introduction of multi-gate devices further increases packing densities of source/drain contacts, gate contacts, and interconnect features connecting thereto. Such increased packing densities call for smaller interconnect features and smaller interconnect features lead to increased current density. Because increased current density increases the rate of electro-migration, it becomes ever more important to implement processes and device structures to prevent electro-migration.

The present disclosure provides a structure and a method to improve the adhesion between a capping barrier layer and an amorphous dielectric layer that surrounds a conductive feature. Processes according to the present disclosure selectively deposits an adhesion layer on the dielectric layer and may include an annealing process to increase crystallinity of the adhesion layer. Due to similar compositions and/or a smaller lattice mismatch between the adhesion layer and the capping barrier layer, adhesion between the capping barrier layer and the dielectric layer is improved. By improving the adhesion between the capping barrier layer and the dielectric layer, the adhesion between the capping barrier layer and the conductive feature is improved and VBDs, TDDB and RC delay due to electro-migration may be reduced.

The various aspects of the present disclosure will now be described in more detail with reference to the figures. FIG. 1 illustrates a flowchart illustrating a method 100 for forming an interconnect structure or a portion thereof from a workpiece, according to one or more aspects of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with fragmentary cross-sectional views of a workpiece 200 (shown in FIGS. 2A, 2B, 3, 4A-7A, and 4B-7B) at different stages of fabrication according to embodiments of method 100. For avoidance of doubts, throughout the figures, the X direction is perpendicular to the Y direction and the Z direction is perpendicular to both the X direction and the Y direction. It is noted that, because the workpiece 200 may be fabricated into a semiconductor device, the workpiece 200 may be referred to as the semiconductor device 200 as the context requires.

Figure 2A:
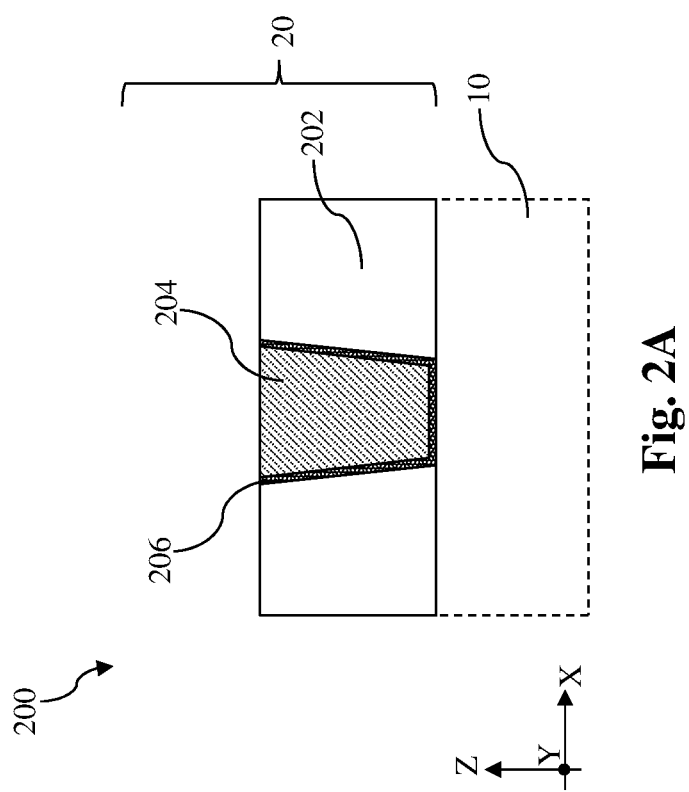
Figure 2B:
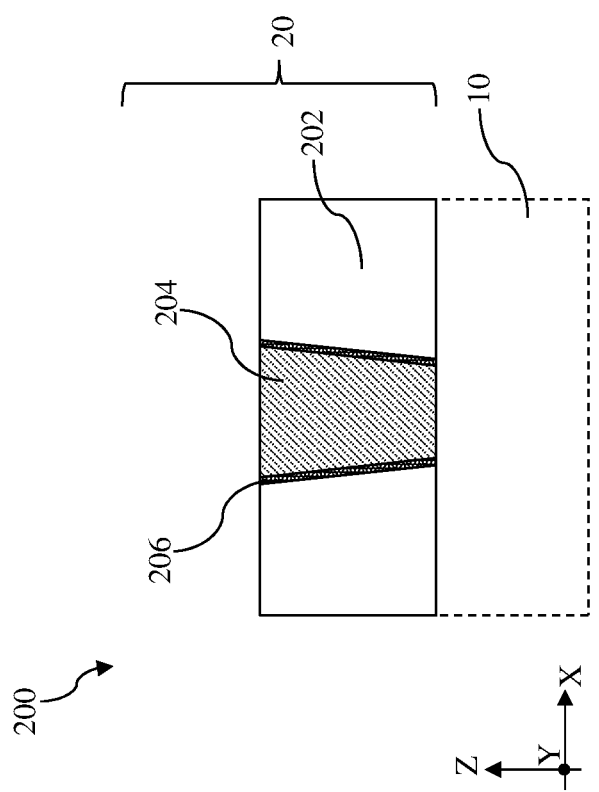

Referring to FIGS. 1, 2A and 2B, method 100 includes a block 102 where a workpiece 200 is received. The workpiece 200 includes a device substrate 10, a dielectric layer 202 over the device substrate 10, a conductive feature 204 disposed in the dielectric layer 202. While not explicitly shown, the device substrate 10 may include a semiconductor substrate, front-end-of-line (FEOL) structures fabricated on the semiconductor substrate, and middle-end-of-line (MEOL) structures coupled to the FEOL structures. The semiconductor substrate may be a silicon (Si) substrate. In some other embodiments, the semiconductor substrate may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The semiconductor substrate may also include an insulating layer, such as a silicon oxide layer, to have a silicon-on-insulator (SOI) structure.

IC manufacturing process flow is typically divided into three levels: front-end-of-line (FEOL), middle-end-of-line (MEOL), and back-end-of-line (BEOL) levels. The FEOL level generally encompasses processes related to fabricating IC devices, such as transistors. For example, FEOL processes can include forming active regions, isolation features, gate structures, and source/drain features. The MEOL level generally encompasses processes related to fabricating contacts to conductive features (or conductive regions) of the IC devices, such as contacts to the gate structures and/or the source/drain features. The BEOL level generally encompasses processes related to fabricating an interconnect structure (also known as a multilayer interconnect (MLI) structure) that interconnects IC features fabricated in FEOL and MEOL processes. Here, FEOL structures may include transistors as well as diodes and other passive devices that are fabricated along with the transistors. Transistors may include multi-gate transistors. MEOL structures may include source/drain contacts coupled to source/drain features of FEOL structures or gate contacts coupled to gate structures of FEOL structures. The interconnect structure 20 shown in FIG. 2A or 2B is fabricated at the BEOL level and is a BEOL structure.

In an example process to form the device substrate 10, the semiconductor substrate is received. In instances where the FEOL structures include MBC transistors, a stack of first semiconductor layers and second semiconductor layers is epitaxially deposited on the semiconductor substrate. The first semiconductor layers and the second semiconductor layers may have different compositions. For example, the first semiconductor layers may include silicon and the second semiconductor layers may include silicon germanium. The first semiconductor layers are interleaved by the second semiconductor layers. A fin-shaped structure is patterned from the semiconductor substrate or from both the semiconductor substrate and the stack. In instances where the FEOL structures include FinFETs, fin structures are patterned from a semiconductor substrate. In some embodiments, a gate-last or gate replacement process may be adopted and a dummy gate stack is formed over a channel region of the fin-shaped structure. The dummy gate stack may include a dummy dielectric layer formed of silicon oxide and a dummy electrode layer formed of polysilicon. After the formation of the dummy gate stack, one or more gate spacer layers are deposited over the dummy gate stack. With the dummy gate stack masking the channel region, the source/drain regions of the fin-shaped structure are recessed. When the FEOL structures include FinFETs, source/drain features are epitaxially formed over the recessed source/drain regions. When the FEOL structures include MBC transistors, the second semiconductor layers are selectively and partially recessed to form inner spacer recesses and dielectric inner spacer features are formed in the inner spacer recesses. After the formation of the inner spacer features, source/drain features are epitaxially formed from the semiconductor substrate and sidewalls of the first semiconductor layers. Depending on the conductivity type of the FEOL structure, the source/drain features may be silicon doped with an n-type dopant, such as phosphorus or silicon germanium doped with a p-type dopant, such as boron.

After the formation of the source/drain features, a contact etch stop layer (CESL) and an interlayer dielectric (ILD) layer are sequentially deposited over the source/drain features. After the deposition of the CESL and the ILD layer, a planarization process is performed to expose the dummy gate stack. When the FEOL structures include FinFETs, the dummy gate stack is replaced by a functional gates structure that includes an interfacial layer, a gate dielectric layer over the interfacial layer, one or more work function layers, and a metal fill layer. When the FEOL structures include MBC transistors, the dummy gate stack is selectively removed to expose the first semiconductor layers and second semiconductor layers in the channel region. The exposed second semiconductor layers are selectively removed to release the first semiconductor layers as channel members. The channel members are vertically stacked and extend between the source/drain features. After the formation of the gate structure, further etch stop layers (ESL) and ILD layers are deposited over the gate structure and the source/drain features. MEOL structures, such as gate contacts and source/drain contacts are then formed to extend through the ESL and ILD layers.

As shown in FIGS. 2A and 2B, the conductive feature 204 in the dielectric layer 202 may represents a conductive feature of the interconnect structure 20. The interconnect structure 20 includes the layer of the conductive feature 204 as well as additional conductive layers over or below the conductive feature 204. The interconnect structure 20 interconnect various devices in the FEOL structures via the MEOL structures and couple FEOL structures to external circuitry. In some embodiments, in order to reduce parasitic capacitance, the dielectric layer 202 may be formed of a low-k (LK) dielectric material or an extreme low-k (ELK) dielectric material. Here, a low-k (LK) dielectric material refers to a dielectric material having a dielectric constant smaller than or equal to that of silicon oxide, which is about 3.9. An extreme low-k (ELK) dielectric material refers to a dielectric material having a dielectric constant smaller than that of the low-k dielectric material. In some embodiments, the dielectric layer 202 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The dielectric layer 202 may be deposited using spin-on coating or chemical vapor deposition (CVD). Due to its composition and fabrication processes, the dielectric layer 202 is amorphous and does not have long-range or short-range crystallinity. In some embodiments, the conductive feature 204 may include copper (Cu) and may be deposited using physical vapor deposition (PVD), electroless plating, electroplating, metalorganic CVD (MOCVD), or other suitable methods. In some other embodiments, the conductive feature 204 includes copper (Cu) and manganese (Mn). In these embodiments, the manganese in the conductive feature 204 may diffuse to the top surface of the conductive feature 204 to form a manganese-rich region to reduce electro-migration. In one embodiments, the conductive feature 204 is disposed over a source/drain feature of a transistor in the device substrate 10.

In some embodiments represented in FIGS. 2A and 2B, the workpiece 200 further includes a barrier layer 206 disposed between the dielectric layer 202 and the conductive feature 204. Because the barrier layer 206 lines the surface of the opening for the conductive feature 204, the barrier layer 206 may also be referred to as a liner 206. In some embodiments represented in FIG. 2A, the barrier layer 206 is conductive and may include titanium, titanium nitride, tantalum, tantalum nitride, molybdenum, ruthenium, nickel nitride, tungsten nitride, copper nitride, manganese nitride, or cobalt nitride. In these embodiments, the barrier layer 206 may be present on the bottom surface and only moderately increases the contact resistance. In some alternative embodiments represented in FIG. 2B, the barrier layer 206 is anisotropically recessed to remove the barrier layer 206 on the bottom surface to reduce contact resistance. In still some embodiments, the barrier layer 206 may be a multi-layer that includes an outer metal nitride layer to interface the dielectric layer 202 and an inner metal layer to interface the conductive feature 204. Because the conductive feature 204 may adhere better to the inner metal layer than to the outer metal nitride layer and the dielectric layer 202 may adhere better to the outer metal nitride layer than to the inner metal layer, the multi-layer arrangement of the barrier layer 206 may improve the adhesion between the conductive feature 204 and the dielectric layer 202. Example outer metal nitride layers may be formed of titanium nitride or tantalum nitride and example inner metal layers may be formed of titanium or tantalum. Additionally, in these embodiments, because the outer metal nitride layers and inner metal layers are electrically conductive, the multi-layer barrier layer 206 may have a construction similar to that shown in FIG. 2A. In some implementations where low resistance is desired, the deposited multi-layer barrier layer 206 may be anisotropically recessed to remove the multi-layer barrier layer 206 on the bottom surfaces such that the conductive feature 204 may be directly in contact with MEOL structures in the device substrate 10 or an underlying conductive feature, as shown in FIG. 2B.

The barrier layer 206 may be deposited using atomic layer deposition (ALD), CVD, physical vapor deposition (PVD), or other suitable methods. The barrier layer 206 serves not only to prevent diffusion of oxygen in the dielectric layer 202 into the conductive feature 204 but also to prevent diffusion of metal atoms from the conductive feature 204 into the dielectric layer 202. To form the workpiece 200 shown in FIG. 2A or 2B, the workpiece 200 is planarized to remove excess barrier layer material and conductive feature material on the dielectric layer 202. In some embodiments, the planarization may be performed using a chemical mechanical polishing (CMP) process. It is noted that the device substrate 10 is only shown in dotted lines in FIGS. 2A and 2B and is omitted from FIGS. 3, 4A-7A, and 4B-7B for simplicity.

Figure 3:
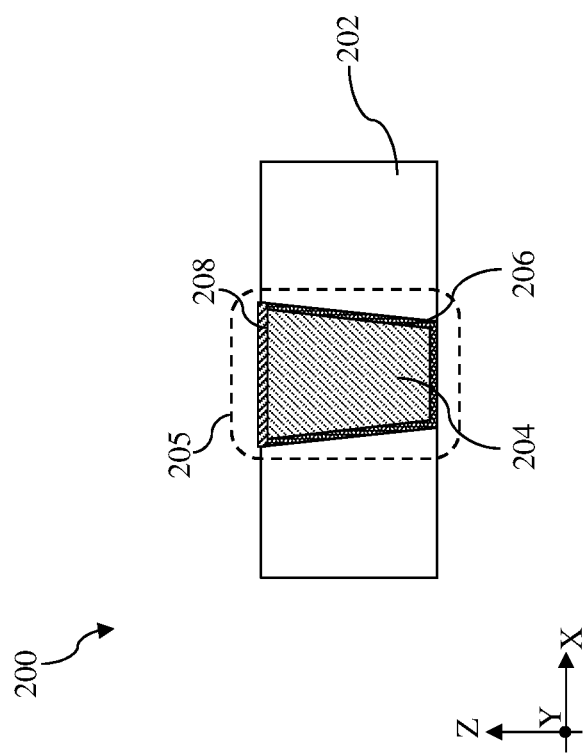

Referring to FIGS. 1 and 3, method 100 may optionally include a block 104 where a conductive capping layer 208 is selectively deposited over the conductive feature 204. The conductive capping layer 208 may also be referred to as a metal cap 208 or a conductive cap layer 208 and is formed from a metal different from the metal that forms the conductive feature 204. In embodiments where the conductive feature 204 is formed of copper, the conductive capping layer 208 may include titanium, tantalum, molybdenum, nickel, cobalt, ruthenium, or other refractory metals. In the depicted embodiment, the conductive capping layer 208 includes cobalt. In some implementations, the conductive capping layer 208 is selectively deposited on the conductive feature 204 using metalorganic precursors each having a metal ion and coordinating ligands. An example cobalt metalorganic precursor may be cyclopentadienylcobalt dicarbonyl (($C_5H_5$)Co(CO)$_2$. As shown in FIG. 3, due to the selective nature of formation, the conductive capping layer 208 is only deposited on the conductive feature 204 and is absent from the surfaces of the dielectric layer 202. Besides serving as a diffusion barrier, the conductive capping layer 208 may also repair damages done to the conductive feature 204 during the planarization process. For ease of reference, the conductive capping layer 208, the conductive feature, and the barrier layer 206 may be collectively referred to as a contact feature 205.

Figure 4A:
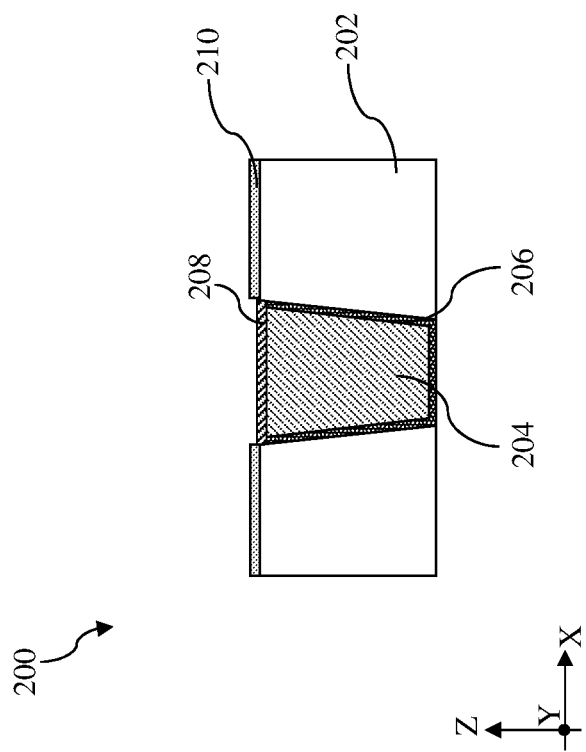
Figure 4B:
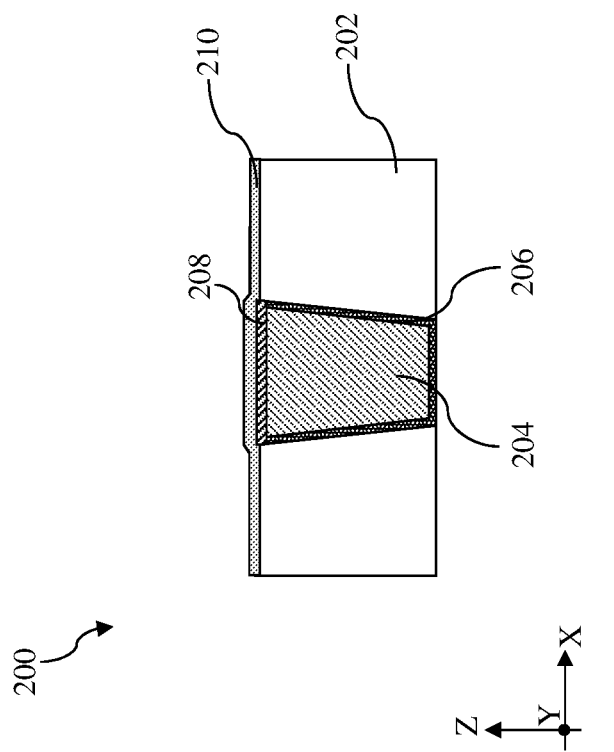

Referring to FIGS. 1, 4A and 4B, method 100 includes a block 106 where a first adhesion layer 210 is deposited over the dielectric layer 202. In some embodiments illustrated in FIG. 4A, the first adhesion layer 210 includes silicon nitride and may be formed by treating the workpiece 200 with a nitrogen-containing plasma, such as an ammonia plasma or a nitrogen plasma. In these embodiments, the nitrogen-containing plasma may be an inductively coupled plasma (ICP) or a transformer coupled plasma (TCP) having an energy level between about 400 Watts (W) and about 600 W. The nitrogen-containing plasma is allowed to react with the surface of the workpiece 200 at a process temperature between about 320° C. and about 500° C. In instances represented in FIG. 4A, the nitrogen-containing plasma may selectively react or adhere to the top surfaces of the dielectric layer 202 due to presence of hydroxyl groups while the surfaces of the barrier layer 206, the conductive feature 204 or the conductive capping layer 208 (if formed) are comparatively inert to the nitrogen-containing plasma at the aforementioned energy level and process temperature due to lack of hydroxyl groups. In some implementations, the nitrogen-containing plasma may be generated in-situ in the process chamber where the workpiece 200 is placed or ex-situ in a remote plasma source and delivered to the process chamber. In these embodiments represented in FIG. 4A, the first adhesion layer 210 may have a thickness between about 1.5 Angstrom (Å) and about 10 Å. Because hydroxyl groups are absent from surfaces of the barrier layer 206, the conductive feature 204, or the optional conductive capping layer 208 (if formed), the first adhesion layer 210 is selectively formed on the top surfaces of the dielectric layer 202. That is, the first adhesion layer 210 is absent from surfaces of the barrier layer 206, the conductive feature 204 and the optional conductive capping layer 208.

In some alternative embodiments illustrated in FIG. 4B, the first adhesion layer 210 may be formed using atomic layer deposition (ALD) and may include silicon nitride, silicon oxide, silicon carbide, silicon, titanium oxide, chromium oxide, or aluminum oxide. In these alternative embodiments shown in FIG. 4B, the deposition of the first adhesion layer 210 is not selective but is conformally over the top surfaces of the dielectric layer 202, the barrier layer 206, the conductive feature 204, and the optional conductive capping layer 208 (if formed). The ALD deposition of the first adhesion layer 210 may be performed at a temperature between about 150° C. and about 350° C. and under a process pressure between about 2500 mTorr and about 3500 mTorr. In these alternative embodiments, the first adhesion layer 210 may have a thickness between about 1.5 Å and about 50 Å.

Figure 5A:
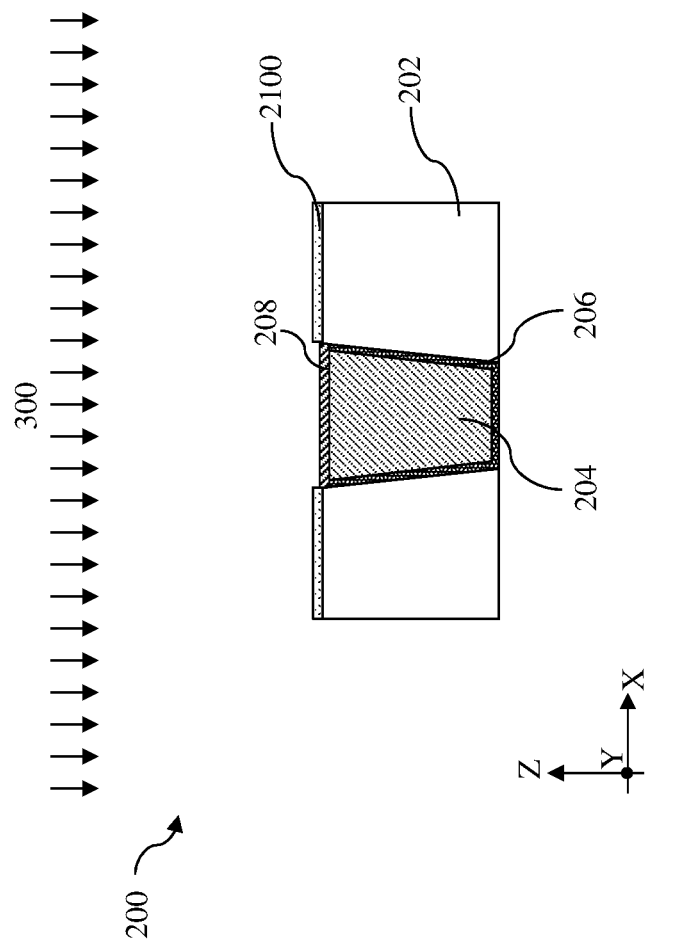
Figure 5B:
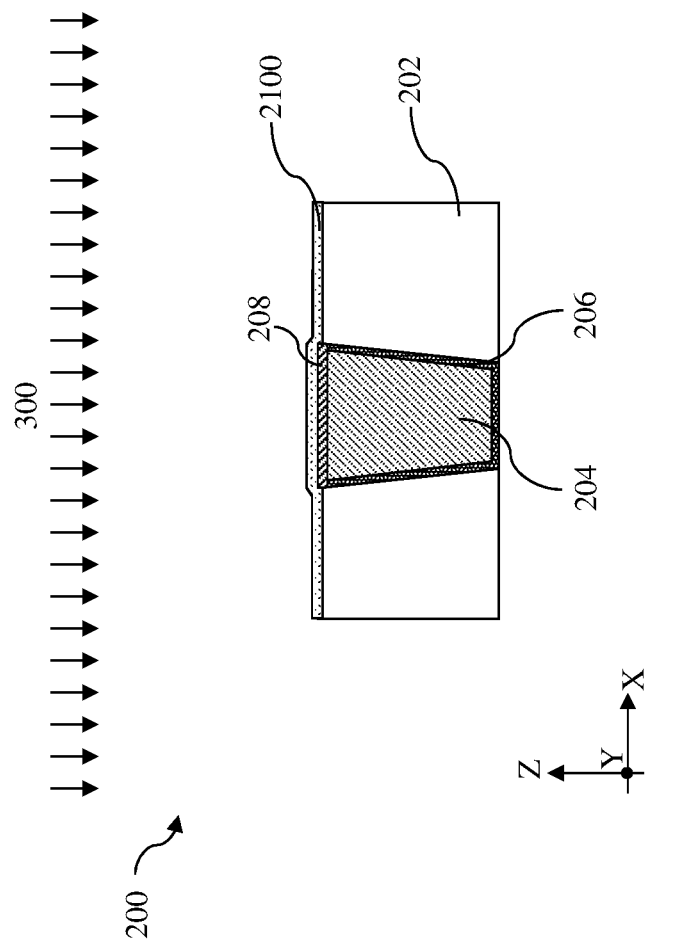

Referring to FIGS. 1, 5A and 5B, method 100 includes a block 108 where the workpiece 200 is annealed in an anneal process 300 to at least partially crystallize the first adhesion layer 210, thereby forming a second adhesion layer 2100. Because the dielectric layer 202 is amorphous, the first adhesion layer 210 formed at block 106 also lacks long-range or short-range orders and is amorphous. As described above, the first adhesion layer 210 may include silicon nitride in the embodiments shown in FIG. 4A or silicon nitride, silicon oxide, silicon carbide, silicon, titanium oxide, chromium oxide, or aluminum oxide in the embodiments shown in FIG. 4B. At block 108, the anneal process 300 serves to increase the degree of structural order (i.e., crystallinity) of the first adhesion layer 210 to between about 40% and about 70%. In some implementations, the anneal process 300 may be a rapid thermal anneal (RTA) process, a laser spike anneal process, a flash anneal process, or a furnace anneal process and may include an anneal temperature between about 800° C. and about 1000° C. The anneal process 300 partially crystallizes and introduces short-range orders into the first adhesion layer 210 in FIG. 4A or 4B. When the first adhesion layer 210 is selectively formed on the dielectric layer 202 as shown in FIG. 4B, the anneal process 300 may transform amorphous silicon nitride in the first adhesion layer 210 into localized beta silicon nitride ($\beta$-Si$_3$N$_4$) regions in the second adhesion layer 2100 shown in FIG. 5B. Silicon nitride may be stable in the forms of alpha silicon nitride ($\alpha$-Si$_3$N$_4$) and beta silicon nitride ($\beta$-Si$_3$N$_4$), both having a hexagonal structure. Because beta silicon nitride is more stable than the alpha silicon nitride at high temperature during the anneal process 300, beta silicon nitride dominates the second adhesion layer 2100. Because the second adhesion layer 2100 includes localized hexagonal beta silicon nitride, the second adhesion layer 2100 includes short-range hexagonal structures. The degree of crystallinity may be measured using X-ray diffraction or differential scanning calorimetry (DSC).

Similarly, when the first adhesion layer 210 is deposited using ALD in the alternative embodiments shown in FIG. 4B, the anneal process 300 may partially crystallize the first adhesion layer 210 and introduce short-range orders. For example, when the first adhesion layer 210 is formed of silicon oxide, the anneal process 300 may transform less-crystalline silicon oxide into localized hexagonal silicon oxide regions. When the first adhesion layer 210 is formed of silicon carbide, the anneal process 300 may transform less-crystalline silicon carbide into localized hexagonal silicon carbide regions. When the first adhesion layer 210 is formed of silicon, the anneal process 300 may transform less-crystalline silicon into localized diamond cubic silicon regions. When the first adhesion layer 210 is formed of titanium oxide, the anneal process 300 may transform less-crystalline titanium oxide into localized tetragonal titanium oxide regions. When the first adhesion layer 210 is formed of chromium oxide, the anneal process 300 may transform less-crystalline chromium oxide into localized hexagonal chromium oxide. When the first adhesion layer 210 is formed of aluminum oxide, the anneal process 300 may transform less-crystalline aluminum oxide into localized hexagonal aluminum oxide. As shown in FIG. 5B, the anneal process 300 increases the degree of structural order (i.e., crystallinity) of the first adhesion layer 210 to form the second adhesion layer 2100 that has a crystallinity between about 40% and about 70%. This crystallinity range is not trivial. On the one hand, it is observed that when the crystallinity is less than 40%, the improvement of adhesion due to reduced lattice mismatch is more likely to be unsatisfactory. On the other hand, although a high degree of crystallinity improves adhesion, raising the crystallinity to over 70% may require too long an anneal time or too high an anneal temperature that may increase manufacturing cost and/or introduce defects. Examples of such defects may include damages to conductive features and metal gate structures.

Figure 6A:
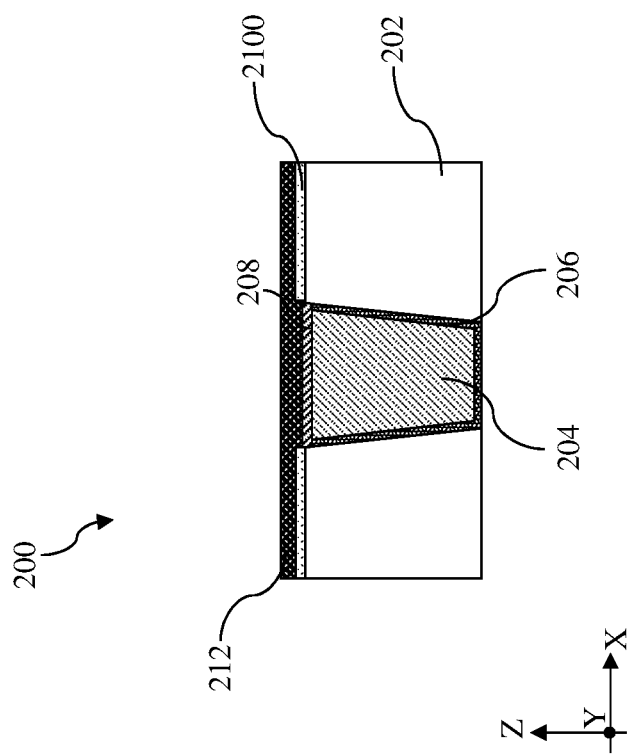
Figure 6B:
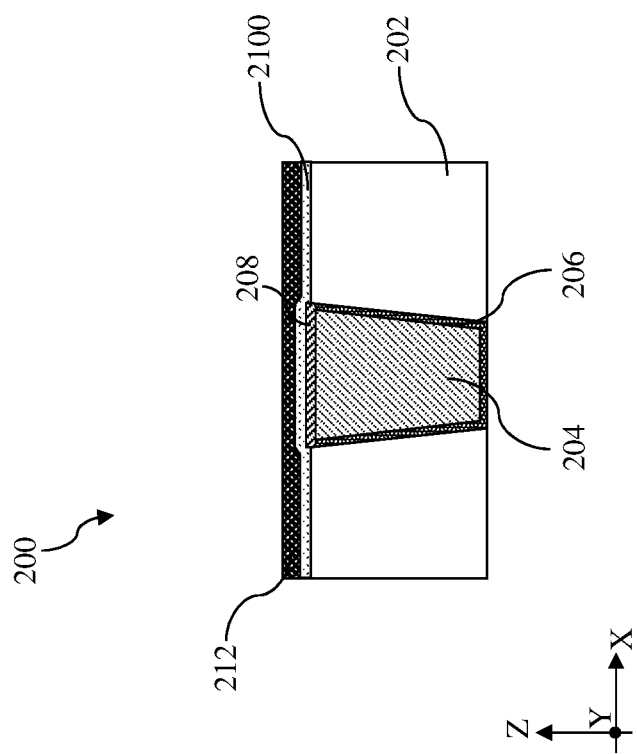

Referring to FIGS. 1, 6A and 6B, method 100 includes a block 110 where a dielectric capping layer 212 is deposited over the conductive capping layer 208 and the second adhesion layer 2100. In some embodiments, the dielectric capping layer 212 includes aluminum nitride and may be deposited using atomic layer deposition (ALD) or plasma-enhanced ALD (PEALD). An example ALD process include use of an aluminum-containing precursor, such as trimethyl aluminum (TMA) and a nitrogen-containing precursor, such as ammonia (NH$_3$). In the example ALD process, the workpiece 200 is heated to a temperature between about 300° C. and about 400° C. and the aluminum-containing precursor and the nitrogen-containing precursors are alternately supplied to the workpiece 200. An inert purge gas, such as argon (Ar), helium (He) or nitrogen (N$_2$), may be used to purge the reaction chamber after one of the precursors is allowed to come in contact with the workpiece 200. In some embodiments, an inert gas plasma may be generated by a plasma generator to enhance or accelerate the ALD process. In those embodiments, the process can be referred to as a plasma enhanced atomic layer deposition (PEALD) process. In some instances, the dielectric capping layer 212 may be formed to a thickness between about 10 Å and about 20 Å. The dielectric capping layer 212 formed using ALD or PEALD may include at least short-range hexagonal Wurtzite crystalline structures. In some alternative embodiments, the dielectric capping layer 212 may include boron nitride and may be deposited using ALD or PEALD. Boron nitride may also have hexagonal or Wurtzite crystal structure.

As shown in FIG. 6A, when the second adhesion layer is selectively formed over the dielectric layer 202, the dielectric capping layer 212 is spaced apart from the dielectric layer by the second adhesion layer 2100 but is in direct contact with the barrier layer 206 (when the conductive capping layer 208 is not formed), the conductive feature 204 (when the conductive capping layer 208 is not formed), or the conductive capping layer 208 (if formed). As shown in FIG. 6B, when the second adhesion layer is conformally formed over the workpiece 200, the dielectric capping layer 212 is spaced apart from the barrier layer 206 (when the conductive capping layer 208 is not formed), the conductive feature 204 (when the conductive capping layer 208 is not formed), or the conductive capping layer 208 (if formed) by the second adhesion layer 2100. The dielectric capping layer 212 may also be referred to as a capping barrier layer 212.

According to the present disclosure, the second adhesion layer 2100 improves adhesion between the dielectric capping layer 212 and the dielectric layer 202. Experiment results demonstrate that the dielectric capping layer 212 adheres better to the second adhesion layer 2100 than the dielectric layer 202 due to reduced lattice mismatch between the second adhesion layer 2100 and the dielectric capping layer 212. It is observed that such improved adhesion reduces electro-migration. In this regard, the localized crystalline regions in the second adhesion layer 2100 reduces lattice mismatch with the dielectric capping layer 212. For example, when the dielectric capping layer 212 is formed of aluminum nitride, it includes hexagonal Wurtzite aluminum nitride that has a lattice constant (a) of 3.110. When the second adhesion layer 2100 is formed of silicon nitride, it includes hexagonal beta silicon nitride that has a lattice constant (a) of 7.608. While a lattice mismatch of about 59% (i.e., (7.608–3.110)/7.608) still exists between hexagonal Wurtzite aluminum nitride and hexagonal beta silicon nitride, it represents about 41% improvement over 100% lattice mismatch between crystalline aluminum nitride and amorphous dielectric layer 202. Similarly, the first adhesion layer 210 and the second adhesion layer 2100 improves adhesion between the dielectric capping layer 212 and the dielectric layer 202 in embodiments where the dielectric capping layer 212 is formed of boron nitride. Hexagonal boron nitride has a lattice constant (a) at about 2.504 and a lattice mismatch of about 67% (i.e., (7.608−2.504)/7.608) with the beta silicon nitride, which represents about 33% of improvement over 100% lattice mismatch between crystalline boron nitride and amorphous dielectric layer 202.

When the first adhesion layer 210 includes silicon oxide, silicon carbide, silicon, titanium oxide, chromium oxide, or aluminum oxide in the alternative embodiments, the second adhesion layer 2100 also may improve adhesion to the dielectric capping layer 212 due to reduced lattice mismatch. In these alternative embodiments, the second adhesion layer 2100 may include hexagonal silicon oxide, hexagonal silicon carbide, diamond cubic silicon, tetragonal titanium oxide, hexagonal chromium oxide, or hexagonal aluminum oxide. Hexagonal silicon oxide has a lattice constant (a) of 4.991. Hexagonal silicon carbide has a lattice constant (a) of 3.073. Diamond cubic silicon has a lattice constant (a) of 5.431. Tetragonal titanium oxide has a lattice constant (a) of 4.58. Hexagonal chromium oxide has a lattice constant (a) of 4.961. Hexagonal aluminum oxide has a lattice constant (a) of 4.785. Although these crystalline forms have lattice mismatches with hexagonal Wurtzite aluminum nitride (or hexagonal boron nitride), these lattice mismatches are smaller than the 100% lattice mismatch between crystalline aluminum nitride (or crystalline boron nitride) and amorphous dielectric layer 202.

Figure 7A:
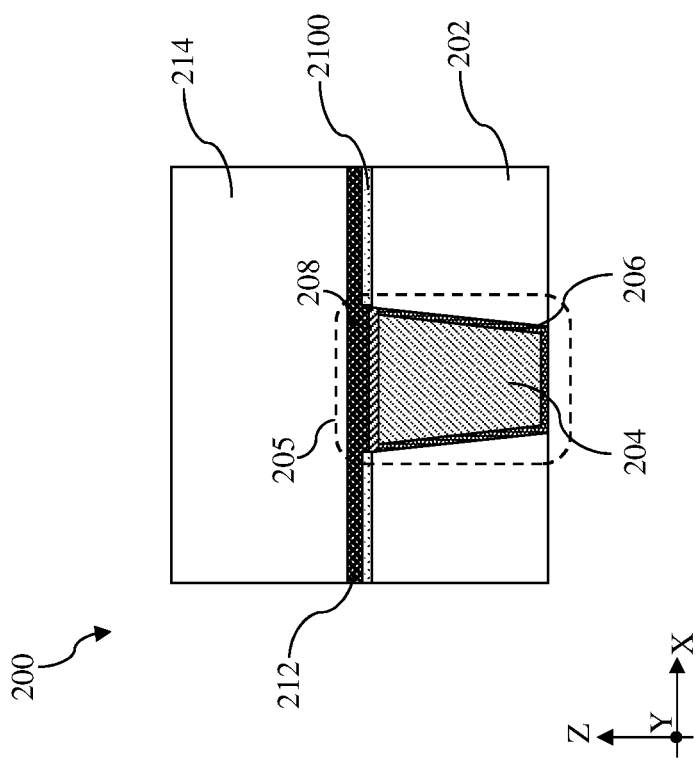
Figure 7B:
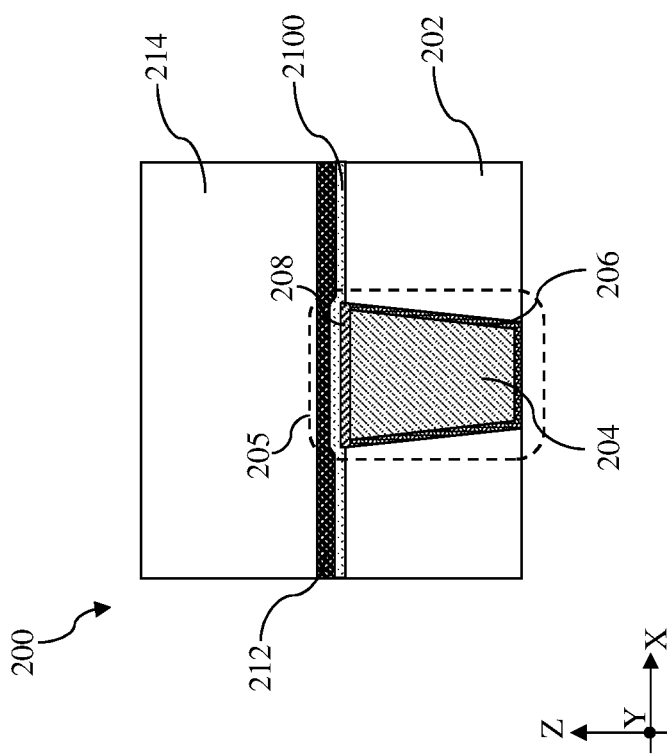

Referring to FIGS. 1, 7A and 7B, method 100 includes a block 112 where further processes are performed. Such further processes may include deposition of an intermetal dielectric (IMD) layer 214 over the workpiece 200. In some embodiments, the IMD layer 214 and the dielectric layer 202 may include similar composition and may be formed using similar processes. In these embodiments, the IMD layer 214 may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The IMD layer 214 may be deposited using spin-on coating or chemical vapor deposition (CVD). While not explicitly shown, further contact features may be formed in the IMD layer 214 and coupled to the conductive feature 204. For example, in embodiments illustrated in FIG. 7A, an opening may be formed through the IMD layer 214 and the dielectric capping layer 212 to expose the conductive feature 204 or the conductive capping layer 208 (if formed). Here, because the etching of the opening slows down at the dielectric capping layer 212, the dielectric capping layer 212 functions as an etch stop layer (ESL). A barrier layer and a metal fill layer similar to those described above may be deposited in the opening. A planarization process may be used to remove excess materials from the top surface of the IMD layer 214 to provide a planar top surface. In embodiments illustrated in FIG. 7B, an opening may be formed through the IMD layer 214, the dielectric capping layer 212, and the second adhesion layer 2100 to expose the conductive feature 204 or the conductive capping layer 208 (if formed). In these embodiments shown in FIG. 7B, both the dielectric capping layer 212 and the second adhesion layer 2100 function as an etch stop layer (ESL). The rest of the process is similar and is not repeated here.

As described above, electro-migration is positively correlated to current density and current density is inversely correlated with dimensions of the conductive features. While processes of the present disclosure may be repeated to throughout layers of the interconnect structure 20 to improve adhesion and reduce electro-migration, it may not be necessary. Conductive features in the interconnect structure 20 may have greater dimensions as they are farther away from the device substrate 10. When the dimensions of the conductive feature are large enough, the risk of electro-migration may be sufficiently small that the first adhesion layer 210 (or the second adhesion layer 2100) is no longer needed. Therefore, depending on the dimension of conductive features in the interconnect structure 20, the first adhesion layer 210 (or the second adhesion layer 2100) of the present disclosure may not be implemented throughout the interconnect structure 20.

In one exemplary aspect, the present disclosure is directed to an interconnect structure. The interconnect structure includes a conductive feature embedded in a dielectric layer, a capping barrier layer disposed over the conductive feature and the dielectric layer, and an adhesion layer sandwiched between the capping barrier layer and the dielectric layer. The adhesion layer includes a degree of crystallinity between about 40% and about 70%.

In some embodiments, the dielectric layer includes amorphous silicon oxide. In some embodiments, the capping barrier layer includes aluminum nitride. In some implementations, the adhesion layer is disposed over the conductive feature. In some instances, the adhesion layer includes beta silicon nitride. In some embodiments, the adhesion layer includes hexagonal silicon oxide, hexagonal silicon carbide, diamond cubic silicon, tetragonal titanium oxide, hexagonal chromium oxide, or hexagonal aluminum oxide. In some embodiments, the interconnect structure may further include a conductive capping layer disposed between the conductive feature and the capping barrier layer.

In another exemplary aspect, the present disclosure is directed to a semiconductor structure. The semiconductor structure includes a contact feature in a dielectric layer. The contact feature includes a metal fill layer, a barrier layer disposed between the metal fill layer and the dielectric layer, and a conductive capping layer over the metal fill layer and the barrier layer. The semiconductor structure further includes a capping barrier layer disposed over the conductive capping layer and the dielectric layer and an adhesion layer sandwiched between the capping barrier layer and the dielectric layer. The capping barrier layer includes aluminum nitride or boron nitride.

In some embodiments, the dielectric layer includes amorphous silicon oxide. In some implementations, the conductive capping layer includes cobalt. In some implementations, the adhesion layer includes beta silicon nitride, hexagonal silicon oxide, hexagonal silicon carbide, diamond cubic silicon, tetragonal titanium oxide, hexagonal chromium oxide, or hexagonal aluminum oxide. In some instances, the adhesion layer includes a degree of crystallinity between about 40% and about 70%. In some embodiments, the barrier layer includes titanium, titanium nitride, tantalum, tantalum nitride, molybdenum, ruthenium, nickel nitride, tungsten nitride, copper nitride, manganese nitride, or cobalt nitride.

In yet another exemplary aspect, the present disclosure is directed to a method. The method includes receiving a workpiece including a dielectric layer and a conductive feature embedded in the dielectric layer, forming an adhesion layer on a top surface of the dielectric layer, and depositing a capping barrier layer over the adhesion layer. The capping barrier layer includes aluminum nitride or boron nitride.

In some embodiments, the dielectric layer includes amorphous silicon oxide and the conductive feature includes copper and manganese. In some implementations, the method may further include, after the forming of the adhesion layer, annealing the workpiece to increase a degree of crystallinity of the adhesion layer. In some instances, the depositing of the capping barrier layer includes use of atomic layer deposition (ALD). In some embodiments, the adhesion layer includes silicon nitride, silicon oxide, silicon carbide, silicon, titanium oxide, chromium oxide, or aluminum oxide. In some embodiments, the method may further include, before the forming of the adhesion layer, selectively depositing a cobalt layer over the conductive feature. In some instances, after the forming of the adhesion layer, the adhesion layer is absent from a top surface of the cobalt layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece including:
      a dielectric layer,
      a conductive feature embedded in the dielectric layer, and
      a barrier layer disposed along an interface between the dielectric layer and the conductive feature to space the conductive feature from the dielectric layer;
   selectively depositing a conductive capping layer on top surfaces of the conductive feature and the barrier layer;
   after the selectively depositing of the conductive capping layer, selectively forming a first adhesion layer over a top surface of the dielectric layer;
   annealing the first adhesion layer to form a second adhesion layer; and
   depositing a dielectric capping layer over the conductive capping layer and the second adhesion layer.

2. The method of claim 1, wherein the selectively depositing a conductive capping layer comprises:
   treating the workpiece with a nitrogen-containing plasma.

3. The method of claim 2,
   wherein the nitrogen-containing plasma comprises ammonia or nitrogen,
   wherein the treating comprises a process temperature between about 320° C. and about 500° C.

4. The method of claim 2, wherein the treating causes the nitrogen- containing plasma to selectively react with hydroxyl groups on the top surface of the dielectric layer.

5. The method of claim 1, wherein the first adhesion layer comprises a thickness between about 1.5 Å and about 10 Å.

6. The method of claim 1, wherein the annealing comprises use of a rapid thermal anneal (RTA) process and an anneal temperature between about 800° C. and about 1000° C.

7. The method of claim 1, wherein the first adhesion layer comprises silicon nitride, silicon oxide, silicon carbide, silicon, titanium oxide, chromium oxide, or aluminum oxide.

8. The method of claim 1, wherein the second adhesion layer comprises beta silicon nitride, hexagonal silicon oxide, hexagonal silicide carbide, diamond cube silicon, tetragonal titanium oxide, hexagonal chromium oxide, or hexagonal aluminum oxide.

9. The method of claim 1, wherein the dielectric capping layer comprises aluminum nitride.

10. The method of claim 1, wherein the selectively depositing of the conductive capping layer comprises use of a metalorganic precursor.

11. A method, comprising:
    receiving a workpiece including:
       a dielectric layer,
       a conductive feature embedded in the dielectric layer, and
       a barrier layer disposed along an interface between the dielectric layer and the conductive feature to space the conductive feature from the dielectric layer;
    selectively depositing a conductive capping layer on top surfaces of the conductive feature and the barrier layer;
    after the selectively depositing of the conductive capping layer, depositing a first adhesion layer over the workpiece using atomic layer deposition (ALD);
    annealing the first adhesion layer to form a second adhesion layer; and
    depositing a dielectric capping layer over the conductive capping layer and the second adhesion layer.

12. The method of claim 11, wherein the conductive feature comprises copper and manganese.

13. The method of claim 11, wherein the barrier layer comprises titanium, titanium nitride, tantalum, tantalum nitride, molybdenum, ruthenium, nickel nitride, tungsten nitride, copper nitride, manganese nitride, or cobalt nitride.

14. The method of claim 11, wherein the depositing of the dielectric capping layer comprises use of ALD or plasma-enhanced atomic layer deposition (PEALD).

15. The method of claim 11, wherein the depositing of the dielectric capping layer comprises use of trimethyl aluminum (TMA) and ammonia ($NH_3$).

16. A contact feature, comprising:
    a dielectric layer;
    a conductive feature embedded in the dielectric layer;
    a barrier layer disposed along an interface between the dielectric layer and the conductive feature,
    a conductive barrier layer disposed on and in direct contact with top surfaces of the conductive feature and the barrier layer;
    an adhesion layer disposed over the dielectric layer and the conductive barrier layer; and
    a dielectric barrier layer over the adhesion layer,
    wherein the dielectric barrier layer comprises aluminum nitride.

17. The contact feature of claim 16, wherein the conductive feature comprises copper and manganese.

18. The contact feature of claim 16, wherein a manganese concentration in a top portion of the conductive feature is greater than a manganese concentration in a bottom portion of the conductive feature.

19. The contact feature of claim 16, wherein the adhesion layer comprises beta silicon nitride, hexagonal silicon oxide, hexagonal silicide carbide, diamond cube silicon, tetragonal titanium oxide, hexagonal chromium oxide, or hexagonal aluminum oxide.

20. The contact feature of claim 19, wherein the adhesion layer comprises a degree of crystallinity between about 40% and about 70%.

* * * * *